United States Patent
Zhu et al.

(10) Patent No.: US 6,402,592 B1
(45) Date of Patent: Jun. 11, 2002

(54) ELECTROCHEMICAL METHODS FOR POLISHING COPPER FILMS ON SEMICONDUCTOR SUBSTRATES

(75) Inventors: Mei Zhu, San Jose; Igor Ivanov, Measanton; Chiu H. Ting, Saratoga, all of CA (US)

(73) Assignee: Steag Cutek Systems, Inc., San Jose, CA (US)

( * ) Notice: Subject to any disclaimer, the term of this patent is extended or adjusted under 35 U.S.C. 154(b) by 0 days.

(21) Appl. No.: 09/761,327

(22) Filed: Jan. 17, 2001

(51) Int. Cl.$^7$ ................................................. B24B 1/00
(52) U.S. Cl. .......................... 451/36; 451/41; 451/907; 451/908
(58) Field of Search ............................ 451/36, 41, 905, 451/907, 908, 909

(56) References Cited

U.S. PATENT DOCUMENTS

| | | |
|---|---|---|
| 5,840,629 A | 11/1998 | Carpio |
| 5,997,712 A | 12/1999 | Ting et al. |
| 6,017,437 A | 1/2000 | Ting et al. |
| 6,153,043 A | * 11/2000 | Edelstein et al. |

OTHER PUBLICATIONS

M. Bohr, "Interconnect Sealing—The Real Limiter to High Performance ULSI" *IEDM Technical Digest*, p. 241 (1995).
P. Pai and C. Ting, "Copper as the Future Interconnection Material," Proceedings of VMIC Conference (Jun. 12–13, 1989.) pp. 258–264.
S. Venkatesan, et al., "High Performance 1.8V, 0.20 μm CMOS Technology with Copper Metallization," *IDEM Technical Digest*, pp. 31.2.1–31.3.4.
R. Contolini, et al., "Electrochemical Planarization for Multilevel Metallization," *J. Electrochem Soc.*, V. 141, No. 9, p. 2503 (1994).
S. Lopatin, et al., "Characterization of Electrodissolving Copper in Aqueous Acid Solution for Sub–Quarter Micron Interconnect Formation in Low k Materials" Extended Abstract No. 741, 196$^{th}$ Meeting of Electrochemical Soc., (1999).
E. Zielinski, et al., "Damascene Integration of Copper and Ultra–Low–k Xerogel for High Performance Interconnects."
R. Powell, et al., "Raising the IC Speed Limit by the Use of Copper Interconnects." (2000).
W. Dresher, "Speeding—up Your Computer in the 21$^{st}$ Century Using Copper ICs" (2000).
P. Singer, "Tantalum, Copper and Damascene: The Future of Interconnects" *Semiconductor International* (Jun. 1998).
A. Wolfe, "Copper upends the Semiconductor Design Landscape" EE Times.com (May 1998).

* cited by examiner

*Primary Examiner*—Joseph J. Hail, III
*Assistant Examiner*—Willie Berry, Jr.
(74) *Attorney, Agent, or Firm*—Connolly Bove Lodge & Hutz LLP (57) ABSTRACT

Methods for electrochemically polishing copper films on semiconductor substrates use an alkaline solution with a pH in the range of about 8.0 to 10.5. A constant current density of from 5 to 100 amperes per square foot is applied to an electrochemical cell formed by an electrode, the alkaline solution and the copper film. Copper is removed at a rate of from 500 to 10,000 angstroms per minute. The end point for the electro-polishing is detected by a sudden change in applied voltage. The alkaline polishing solution may also contain copper ions so that when the current direction is reversed, copper is deposited onto the copper film. Furthermore, this copper deposition will occur selectively on the exposed copper surface but not on the exposed barrier layer surface. Hence, the method can compensate for dishing and erosion by re-depositing copper in regions after too much copper was removed from those regions.

39 Claims, 6 Drawing Sheets

ELECTROCHEMICAL METHODS FOR POLISHING COPPER FILMS ON SEMICONDUCTOR SUBSTRATES

BACKGROUND OF THE INVENTION

1. Field of the Invention

This invention relates to the field of electrochemical deposition and removal of copper, and, more particularly, to electrochemically polishing copper films.

2. Background of the Invention

In the manufacture of devices on semiconductor substrates, such as semiconductor wafers, multiple levels of conductive layers are applied to the substrate. In order to fabricate features, circuits, vias and devices on the substrate, various techniques are used to deposit and etch materials on the substrate. Deposition techniques include processes such as physical vapor deposition (PVD), chemical vapor deposition (CVD), and immersion of the substrate into an electrolyte solution. This last technique may be used for either electroless deposition or electroplating.

Similarly, a number of techniques are known for removing a material from a wafer. These techniques include wet chemical etching, reactive ion etching (RIE), plasma etching, chemical mechanical polishing (CMP), and immersion of the wafer into an electrolyte solution. Material removal by subjecting an immersed wafer to an electrolyte employs equivalent equipment set-up to that used for electroplating, but with an opposite result because charged particles are removed from, rather than deposited onto, the wafer.

Plating systems, in which an object is immersed in a plating solution to plate metal onto the object, are well known in the art. A variety of metals can be plated by simple immersion, or electroplated when electrodes are introduced into the solution. In copper plating, a plating solution such as a mixture of copper sulfate ($CuSO_4$) and sulfuric acid ($H_2SO_4$) is used as the source of copper to plate copper onto an object. Typically, a cathode is connected to the object that is to be plated (so that the object functions as the cathode electrode) and a potential is placed across the cathode and an anode. Copper ions in the solution will then be reduced onto the cathode electrode (namely, the object to be plated).

In the traditional copper plating approach, the anode electrode is usually made of copper, which dissolves into the plating solution to replace the copper ions as the copper ions are depleted. However, for precision plating, inert anodes are used so that the anode does not change shape during the plating process. Instead of the copper ions being oxidized from the anode material, some other source of copper is needed. In this instance, copper containing material is introduced into the plating solution. That is, an external source is used to replenish copper ions in the solution as the copper ions are depleted from the solution due to the plating action.

Traditional complementary metal oxide semiconductor (CMOS) integrated circuits have been based on aluminum conductors and a silica ($SiO_2$) dielectric. As devices become faster and more complex, the conductors on the chip must occupy less space, and become narrower and narrower. Conductors of less than 0.25 microns are common, and current targets are for conductors of 0.13 microns to 0.1 microns or smaller. Low dielectric constant materials are also being developed to replace the standard $SiO_2$ dielectric to reduce the capacitance associated with the conductive lines. A wide variety of low K dielectric materials have been studied, such as F- and C-doped silicate glass, polymers such as polyarylether and polyimides, and porous versions of these materials, including xerogels and aerogels.

Copper metallization processes have been developed to replace the traditional aluminum interconnect. Copper has about two-thirds the electrical resistance of aluminum, making copper a much better conductor. In addition to low resistance, copper exhibits higher interconnect speed and higher resistance to electron migration. P. Singer, "Tantalum, Copper and Damascene: The Future of Interconnects", *Semiconductor International*, June 1998.

Currently, copper is applied to silicon semiconductor substrates or wafers with either a single or dual damascene metallization process. In a typical metallization process: (0) conductor trenches or via holes are etched into a dielectric layer, which can be standard $SiO_2$ or another low K permitivity dielectric material, on a semiconductor substrate; (1) an interface barrier layer is deposited on the substrate using PVD or chemical vapor deposition (CVD); (2) a copper seed layer is deposited onto the barrier layer using PVD or CVD; next (3) copper is deposited by electrochemical deposition (ECD), typically with an acidic copper electroplating solution, to fill in the features, such as via holes and conductor trenches, on the semiconductor substrate; finally (4) excess copper and barrier layer materials are removed from the field region using a chemical mechanical planarization (CMP) process. Dresher W. H., "Speeding-up your computer in the $21^{st}$ century using Copper ICs".

The diffusion barrier is used to prevent copper from migrating into the dielectric material and into the silicon substructure of the semiconductor substrate. Examples of the barrier layer materials are cobalt, chromium, nickel, palladium, tantalum, tantalum nitride, titanium, titanium nitride, tungsten, tungsten nitride, tungsten silicon nitride, tantalum silicon nitride, among others. Examples of the dielectric materials are silicon dioxide ($SiO_2$), F- and C-doped silica glass, silica aerogels, xerogels and organic polymers. Some of these example low-K dielectric materials are porous and have low mechanical strength. The mechanically weaker low-K materials make them incompatible with standard chemical-mechanical polishing (CMP) methods currently used in ULSI manufacturing processes because these materials are prematurely removed with the copper during the CMP process that is intended to remove only the excess copper and barrier layer. An improved process for polishing copper is needed.

As is known in the art, CMP is a semiconductor fabrication technique using (a) a chemical solution that contains a slurry, and (b) a polishing pad. The chemical solution and pad are applied to the wafer to planarize or remove excess material from the wafer surface. One disadvantage of CMP processes is that too much copper or dielectric material may be removed from regions on the semiconductor substrate when polishing continues too long. The excessive removal of copper is called "dishing" and the excessive removal of dielectric material is called "erosion." The relative softness of the copper as compared to the substrate surfaces can make it difficult to detect the proper end-point for the CMP process.

Standard methods for electro-polishing or Electro-Chemical Polishing ("ECP") copper are usually performed in an acidic solution, such as phosphorous acid. A relatively great amount of material is removed from the wafer in order to obtain a smooth surface. Electro-polishing in acid to remove great amounts of copper is not compatible with copper metallization processes used in ULSI fabrication, where the deposited copper layer usually is quite thin (e.g., 1 μm). One goal of the present invention is to obtain a very smooth surface by removing less than one micrometer of copper material from the substrate. Another goal is to set and try to reach a clearly defined end point to stop the electro-polishing process at the interface between the copper and the barrier layer. Excessive "dishing" of the copper surface should be avoided where possible.

SUMMARY OF THE INVENTION

Methods for electrochemical polishing of copper films on semiconductor substrates for integrated circuit fabrication to remove copper material without chemical-mechanical-polishing (CMP) are disclosed. A semiconductor substrate with a copper film residing thereon is immersed in an alkaline solution (pH above 7). The alkaline solution contains cyanide, copper salts, such as CuCN, complexing agents, such as KCN, a base, such as KOH, a buffer agent, such as $Na_2CO_3$ (Na can be used to replace K) and organic additives, such as wetting agents and grain refiners. A cyanide-free solution is preferred for safety and environmental reasons. A cyanide-free alkaline solution contains copper salts, such as $CuS_4$ or copper pyrophosphate, a complexing agent, such as pyrophosphate or ethylenediamine, a base such as NaOH or KOH, and organic additives. In some semiconductor applications, mobile ions, such as Na+ or K+, are not preferred, so an organic base, such as $NH_4H$ may be used in place of base solutions containing Na+ and K+. Thus the alkaline solution may contain one or more of copper salts, copper sulfate, copper pyrophosphate, alkali metal pyrophosphates, including sodium pyrophosphate, ammonium pyrophosphate, orthophosphate, sodium hydroxide, potassium hydroxide, ammonium hydroxide and ethylenediaminetetraacetic acid.

A counter electrode is placed in contact with the alkaline solution. To remove copper material from the copper film and thereby polish the film surface, the copper film forms the anode, and the counter electrode forms the cathode. A constant current is applied, preferably with a current density from 5 to 100 amperes per square foot, most preferably from 5 to 30 amperes per square foot. The alkaline solution is maintained preferably at a temperature of 70° F. or above, most preferably in the range of 70° F. to 150° F.

The end point of the copper removal method is best detected by monitoring the applied voltage. An increase in the voltage indicates that the remaining copper film is becoming very thin. A sudden increase in the voltage indicates that all copper has been completely removed and the barrier layer surface, such as tantalum nitride (TaN), for example, is exposed. The barrier layer, usually Ta or TaN, does not dissolve in the electro-polishing solution. Because the barrier layer is conductive, but has a much higher resistivity than copper, a jump in voltage occurs when the copper film is gone.

The method of the invention produces a very smooth copper surface on the substrate after removing only a relatively small amount of copper (usually less than one micrometer). The method also stops removing materials on the barrier layer, thus giving a clear end point to the polishing. An additional advantage of the electrochemical polish method of the present invention is that it may be used also to deposit copper selectively onto an existing copper film, thereby to improve the quality of the film surface. By reversing the electrode potential (by making the wafer surface a cathode electrode), copper will plate on the exposed copper surface, but not plate on the exposed barrier layer surface, such as a tantalum (Ta) or tantalum nitride (TaN) layer. When depositing copper in this manner, the copper material does not deposit onto the barrier layer. CMP processes can remove a greater amount of copper from the central portion of a copper trench leaving a dished surface. If not controlled properly, electro-polishing processes may also remove more copper material than intended to leave a dished surface. Using the method of this invention, but reversing the direction of the current, copper may be deposited selectively onto the dished surface to restore the planarity of that surface. Therefore, multiple cycles of deposition and etching can be implemented to produce desired surface conditions.

DESCRIPTION OF THE PREFERRED EMBODIMENTS

In the present invention, instead of CMP, copper electropolishing processes are used to remove the excess material from a copper film on a semiconductor substrate surface. The copper film surfaces are polished in an alkaline-based chemistry with a pH above 7 using a constant current mode.

During electro-polishing of copper, an electrochemical cell is formed by the copper film, the alkaline solution and a counter electrode. An electrical field is applied across the copper surface and the counter electrode. The copper film to be polished forms the anode and the counter electrode is the cathode of the electrochemical cell. Using constant current, excess copper is removed. Preferably, the current density is from 5 to 100 amperes per foot, most preferably 5 to 30 amperes per square foot. The process temperature is maintained in the range from room temperature (generally about 70° F.) to 150° F. The copper etching or removal rate may be controlled by controlling the current applied to the electrochemical cell. A typical etching rate is from 0.5 to 10 thousand angstroms per minute. Preferably, the polishing rate used is selected within the range of 500 to 5000 angstroms per minute, or a polishing time of 2 to 20 minutes for a 1 micron film. The current preferably is from 1 to 10 amperes for an eight-inch diameter semiconductor wafer.

The semiconductor substrate is immersed in an alkaline based solution, preferably free of cyanide. Ideal alkaline solutions for use in the process contain copper, generally in an ionic state, Cu++. The amount of copper is generally in the range of 0.1M, or 6 grams per liter to 0.4M or 25 grams per liter. Greater and lesser amounts may work satisfactorily. Copper can be supplied by adding common copper salt, such as copper sulfate or copper pyrophosphate to the alkaline solution. The solution also contains one or more complexing agents, such as sodium pyrophosphate or ethylenediamine or ethylenediaminetetracetic acid (EDTA), in an amount preferably between 0.1M to 1.0M. Strong base solutions, such as NaOH or KOH are used to adjust the pH of the solution. Alternatively, $NH_4$ or an organic base can be used instead of base solutions with Na+ and K+ ions. Commercially available alkaline based solutions such as COBRE and E-Brite 30/30 have been used for electro-polishing in the invention. Preferably the pH of the alkaline solution is from 8.2 to 10.5.

U.S. Pat. No. 6,017,437 discloses a process chamber that may be used for depositing copper onto or removing copper from a semiconductor substrate. The description of the processing chamber in the '437 patent is incorporated herein by reference.

Figure 1:
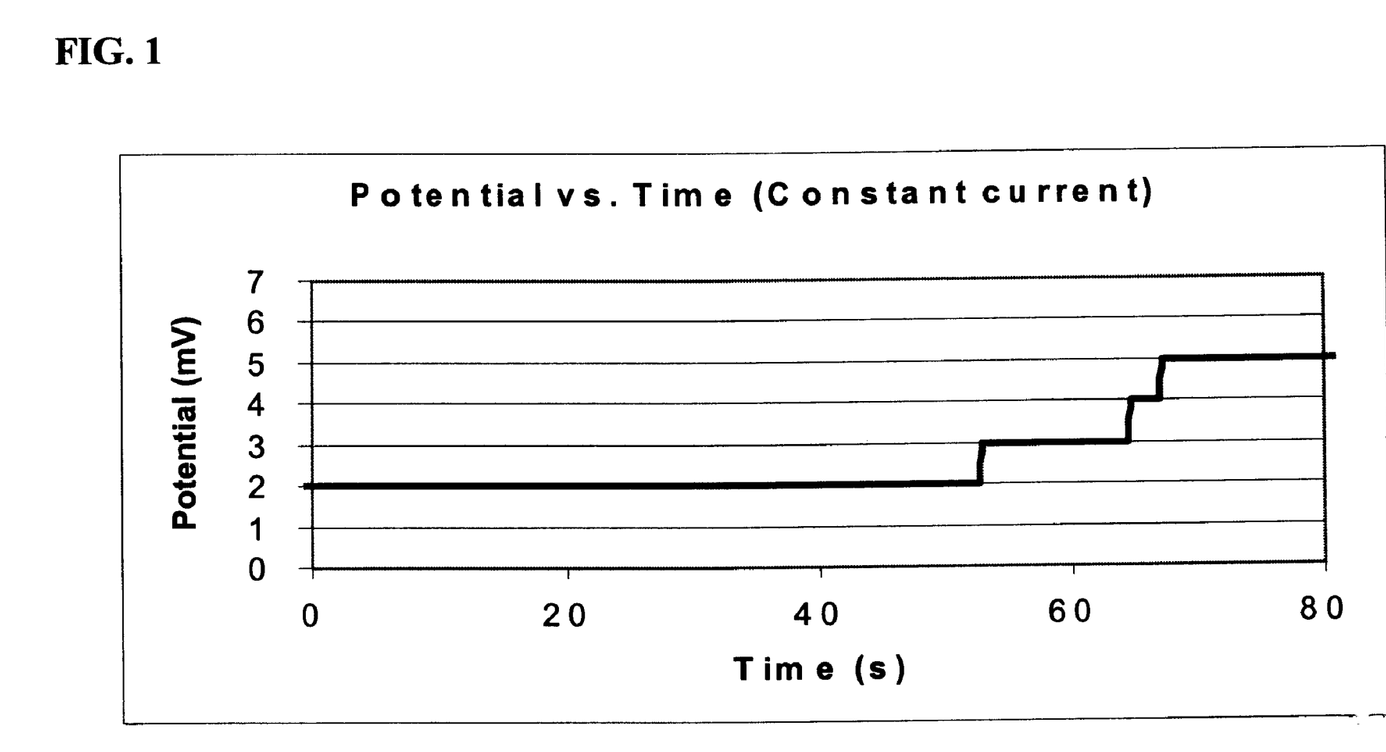
FIG. 1 is a graph plotting voltage potential (mV) versus time for a representative electrochemical polishing at constant current of a copper film on a semiconductor substrate.

For most semiconductor substrates with copper films, the end point for the polishing step is readily determined. Referring to FIG. 1, a representative graph of voltage potential (mV) versus time is presented. When electro-polishing of a copper film on a tantalum nitride (TaN) dielectric barrier surface was carried out under constant current, the end point of the copper removal was detected by the first sudden increase in the applied voltage, which is indicated by vertical step 12 in FIG. 1. This end point occurred between 50 and 60 seconds for the example of FIG. 1. The sudden change in voltage indicates a change in the applied voltage necessary to maintain the constant current density flow through the wafer surface. This phenomenon appears to be attributable to the complete removal of copper film from the barrier surface. Because the copper film has a much lower resistivity than the barrier layer film, TaN in this instance, a much higher voltage is required to drive the electrochemical cell to maintain a constant current.

The copper polishing process of the invention thus can automatically stop on the barrier layer, which may be tantalum nitride (TaN) as one example. If desired, the barrier layer may then be removed by separate processing, such as separate wet chemical etching, electro-etching or CMP.

The electrochemical polishing method according to the invention is not dependent upon the type of dielectric material used in the semiconductor substrate. The dielectric material may be silica, $SiO_2$, F-doped silicate glass, C-doped silicate glass, other doped silicate glasses, polyarylethers, polyimides, polytetrafluoroethylene and carbon polymers. The dielectric material also may be a porous material, such as xerogels, aerogels, porous silicas, porous carbon polymers, porous polyarylethers, and porous polytetrafluoroethylene.

An advantage of the electro-polishing process of the invention over CMP or other known electro-polishing process is that a smooth surface is obtained with removing only a small amount of copper (generally less than one micron), and the direction of the current may be reversed if copper deposition, rather than copper removal, is desired. Using the same alkaline solution and equipment, copper film may be preferentially deposited on the copper surface within trenches or other structures without depositing copper in the field area on exposed barrier material. Hence, it is possible to etch/remove and deposit/apply copper using the same alkaline treating bath and equipment and achieve desired planarization of the copper surfaces without using CMP.

Figure 4:
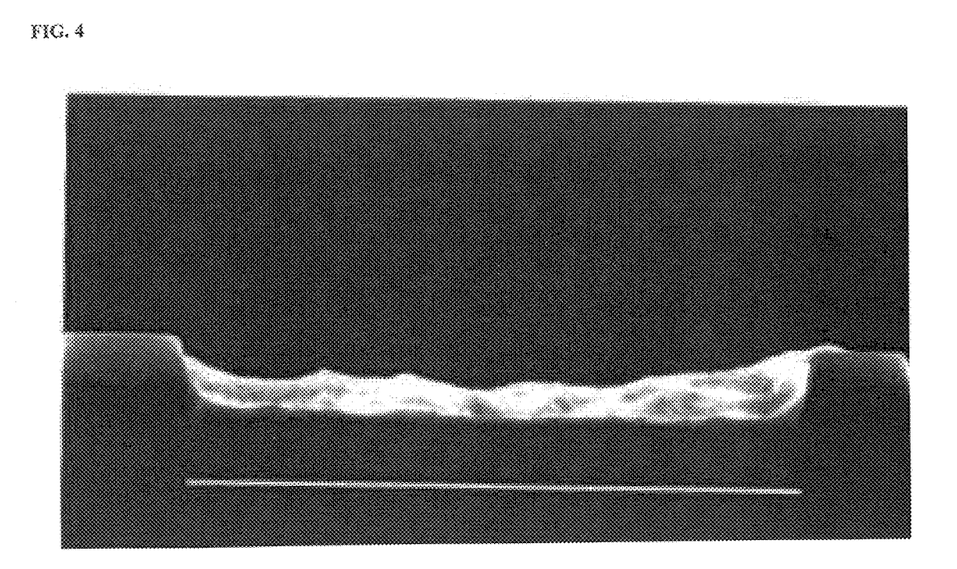
FIG. 4 is a scanning electron microscope (SEM) photograph at approximately 10,000×magnification of a polished sample with copper held within trenches approximately ten microns wide, wherein the copper surface is severely dished.
Figure 5:
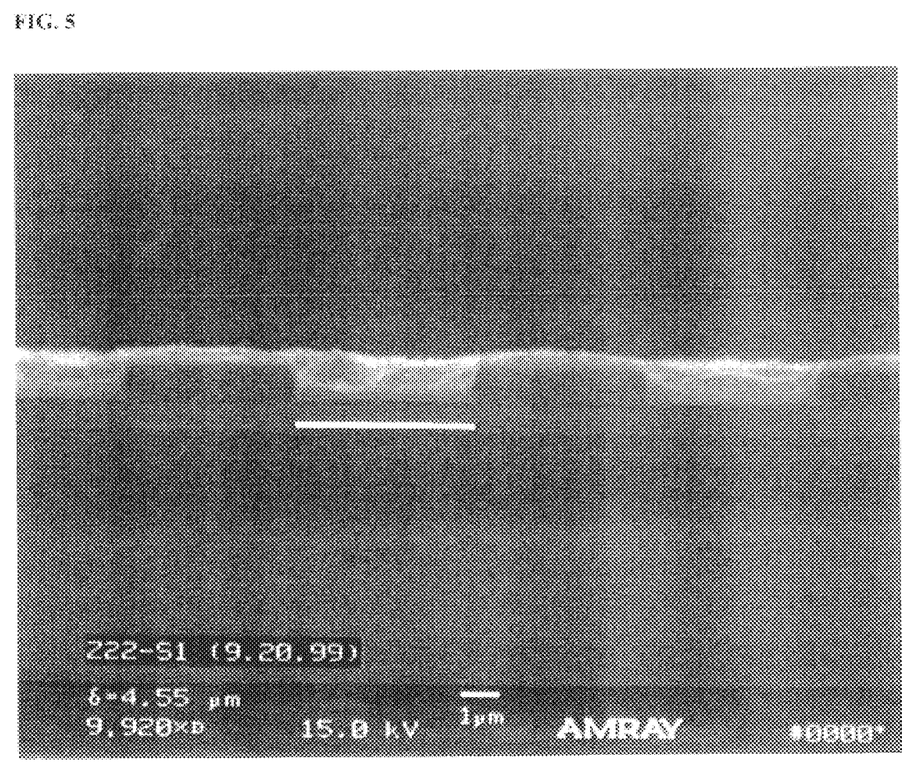
FIG. 5 is a scanning electron microscope photograph showing a five micron wide trench which is slightly dished.

Referring to FIGS. 4 and 5, the photographs show copper deposited within trenches that are ten microns wide and five microns wide, respectively. The copper surface within the trench is not planar to the surface of the dielectric in FIG. 5, but the "dishing" is most noticeable in the larger features that are illustrated. The dishing resulted primarily because the original film was deposited in the trench without forming a planar top surface. A more planar copper film may be deposited using the "dep-etch" process of the invention. Alternatively, the planarization may be improved/corrected by depositing additional copper into the larger geometries to give a more planar surface before the ECP or electro-polishing process.

Figure 6:
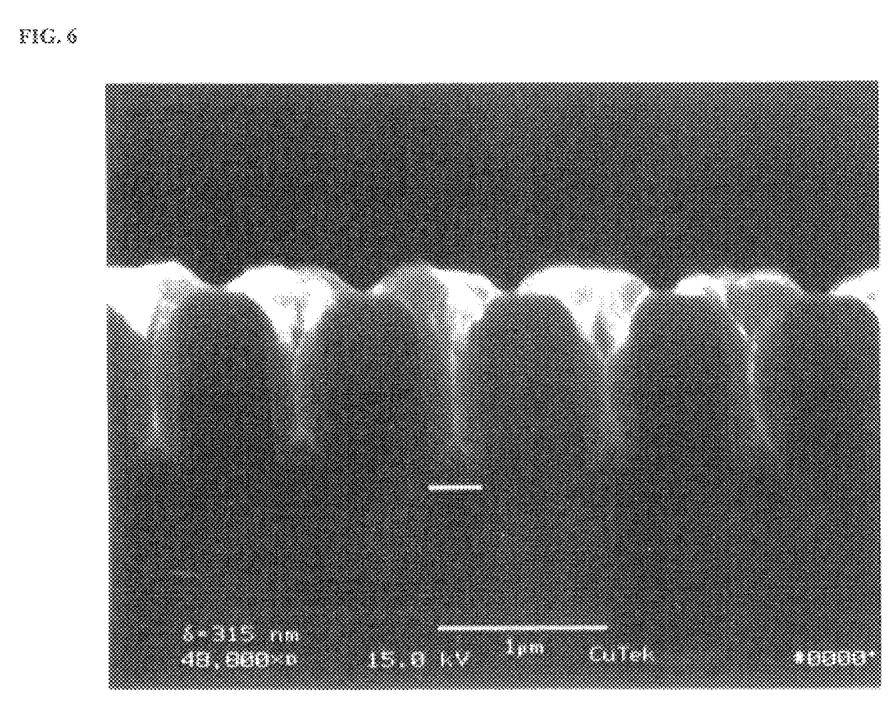
FIG. 6 is a scanning electron microscope (SEM) photograph at approximately 25,000×magnification showing that upon re-depositing copper over the field region the copper selectively deposits only in the trenches, causing overgrowth of copper deposition of copper within the trenches, but without copper deposition in the field region.

Referring next to FIG. 6, the photograph shows that after the removal of copper from the field region, copper was intentionally deposited in an excess amount inside the trenches, but still was not deposited upon the field region. Hence, the electrochemical polishing process of the invention may be operated in reverse to deposit copper selectively onto dished surfaces within trenches to correct surface planarity. The sample could then be subjected to ECP or CMP processes to again give a more planar surface. The "dep-etch" process can be repeated numerous times until the desired surface planarity is achieved.

The invention is further illustrated, but not limited by, the following examples.

EXAMPLES

Electrochemical polishing of copper was performed on semiconductor wafers or pieces of such wafers. Prior to polishing, several layers were applied to the silicon wafer surfaces. The processing steps included patterning; etching, barrier-seed deposition and copper film electroplating. The samples had the following film stack:

0. Patterns, typically sub-micron in opening sizes, etched into the dielectric layer by standard processing
1. 350 Å TaN barrier layer
2. 1500 Å PVD copper seed layer
3. 1.5 micron electrochemically deposited (ECD) copper.

The film thickness in the example was chosen for purposes of this example. Those of skill in the art will select other film thicknesses for other devices and device requirements.

Figure 2:
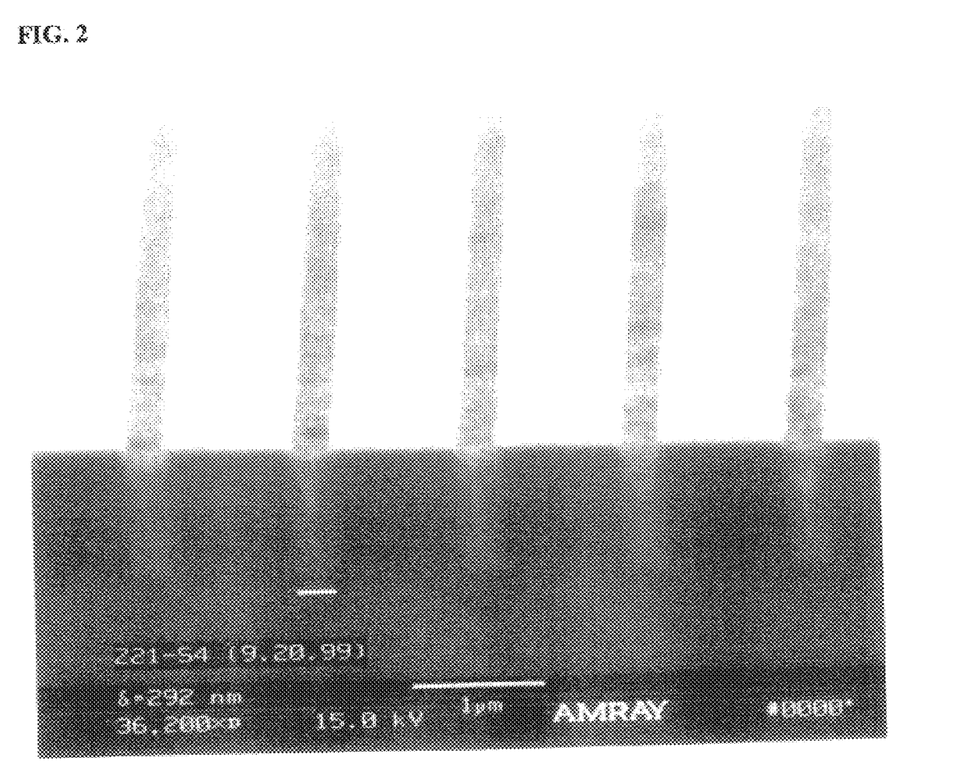
FIG. 2 is a scanning electron microscope (SEM) photograph at approximately 20,000×magnification of a cross-section of a polished sample with copper film held within trenches about 0.3 micron wide.

FIG. 2 is a photograph showing a cross-section of copper film held within less than one micron width trenches. The copper film over the field region has been polished away by the electro-polishing process of the invention, exposing the TaN barrier surface. At the same time, the copper film in the trenches remains intact. The process producing the example shown in FIG. 2 was carried out at room temperature (about 70° F.), using a polishing rate in the range of about 2000 angstroms per minute, polishing for about five minutes, and using a current of about 5 amperes.

Figure 3:
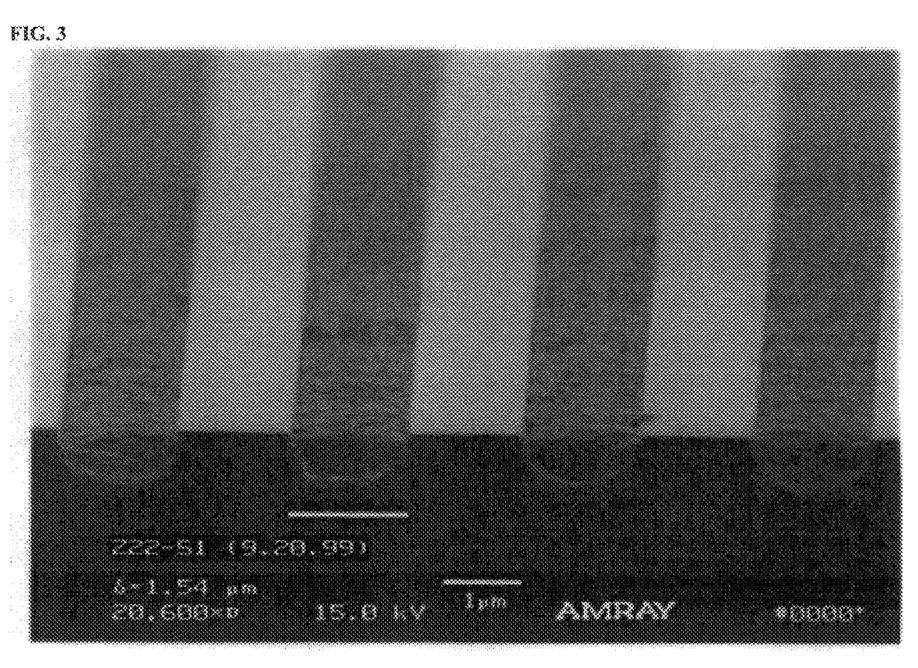
FIG. 3 is a scanning electron microscope (SEM) photograph at approximately 15,000×magnification of a cross-section of a polished sample with copper held within trenches approximately one micron wide.

FIG. 3 illustrates a cross-section of copper film held within trenches that are slightly more than one micron wide. The copper film over the field region has been polished away using the electro-polishing process of the invention to expose the TaN barrier surface. Small amounts of copper residue remained in the field area. These residues may be due to a non-uniformly deposited film or a non-uniform removal. However, the small residues observed here can be eliminated under optimized process conditions or removed easily during the subsequent barrier layer removal or cleaning process. The electro-polish process used for the example shown in FIG. 3 was comparable to that used for the example in FIG. 2.

The invention has been illustrated by detailed description and examples of the preferred embodiment. Various changes in form and detail will be within the skill of persons skilled in the art. Therefore, the invention must be measured by the claims and not by the description of the examples or the preferred embodiments.

We claim:

1. A method for polishing a copper film on a semiconductor substrate, comprising the steps of:
   (1) immersing the semiconductor substrate having a copper film applied onto at least a portion of a surface thereon into an alkaline solution;
   (2) providing a cathode in contact with the alkaline solution that together with the copper film and alkaline solution forms an electrochemical cell; and
   (3) applying a current to the electrochemical cell so that a portion of the copper film is removed.

2. The method of claim 1, wherein the alkaline solution contains copper ions as a source of copper for electroplating.

3. The method of claim 1, further comprising, applying a dielectric material to the semiconductor substrate prior to applying a copper film thereon.

4. The method of claim 3, wherein the dielectric material has a low permitivity (K).

5. The method of claim 3, wherein the dielectric material is selected from the group consisting of: silica, $SiO_2$, F-doped silicate glass, C-doped silicate glass, other doped silicate glasses, polyarylethers, polyimides, polytetrafluoroethylene and carbon polymers.

6. The method of claim 3, wherein the dielectric material is selected from the group consisting of: xerogels, aerogels, porous silicas, porous carbon polymers, porous polyarylethers, and porous polytetrafluoroethylene.

7. The method of claim 1, wherein the current is applied at a density of from 5 to 100 amperes per square foot.

8. The method of claim 7, wherein the current density is from 5 to 30 amperes per square foot.

9. The method of claim 1, wherein the current applied to the electrochemical cell is constant.

10. The method of claim 1, wherein a constant voltage is used in the electrochemical cell.

11. The method of claim 10, further comprising shutting off the voltage after a decrease in current is detected.

12. The method of claim 1, wherein the alkaline solution is maintained at a temperature at or above 70° F.

13. The method of claim 12, wherein the temperature of the alkaline solution is maintained in the range of from room temperature to 150° F.

14. The method of claim 1, wherein the alkaline solution has a pH above 7.

15. The method of claim 14, wherein the alkaline solution has a pH in the range of 8.0 to 10.5.

16. The method of claim 1, wherein the alkaline solution is formed from a mixture of materials selected from the group consisting of copper salts, copper sulfate, copper pyrophosphate, alkali metal pyrophosphates, including sodium pyrophosphate, ammonium pyrophosphate, orthophosphate, sodium hydroxide, potassium hydroxide, ammonium hydroxide and ethylenediaminetetraacetic acid.

17. The method of claim 1, wherein copper is removed at a rate in the range of from 500 to 10,000 angstroms per minute.

18. The method of claim 17, wherein copper is removed at a rate in the range of 1000 to 5000 angstroms per minute.

19. The method of claim 1, further comprising shutting off the current after an increase in applied voltage is detected.

20. A method for alternatively selectively removing copper from and selectively depositing copper onto a copper film on a semiconductor substrate, comprising the steps of:
   (1) immersing the semiconductor substrate having a copper film applied to at least a portion of a surface thereon into an alkaline solution;
   (2) providing an electrode in contact with the alkaline solution that together with the copper film and alkaline solution forms an electrochemical cell;
   (3) applying a current to the electrochemical cell to selectively remove a portion of the copper film; and
   (4) optionally applying a reverse current to the electrochemical cell to selectively deposit copper onto the copper film.

21. The method of claim 20, wherein steps (1) to (4) are repeated until a substantially planar surface is formed on the copper film.

22. The method of claim 20, wherein the current is applied at a density of from 5 to 100 amperes per square foot.

23. The method of claim 20, wherein the reverse current is applied at a density of from 5 to 100 amperes per square foot.

24. The method of claim 20, wherein the current applied to the electrochemical cell is constant.

25. The method of claim 20, wherein a constant voltage is used in the electrochemical cell.

26. The method of claim 20, wherein the reverse current applied to the electrochemical cell is constant.

27. The method of claim 20, wherein a constant voltage is used to establish the reverse current.

28. The method of claim 20, wherein the alkaline solution is maintained at a temperature at or above 70° F.

29. The method of claim 28, wherein the temperature of the alkaline solution is maintained in the range of room temperature to 150° F.

30. The method of claim 20, wherein the alkaline solution has a pH above 7.

31. The method of claim 30, wherein the alkaline solution has a pH in the range of 8.5 to 10.5.

32. The method of claim 30, wherein copper is removed at a rate in the range of from 500 to 10,000 angstroms per minute.

33. The method of claim 32, wherein copper is removed at a rate in the range of from 5,000 to 10,000 angstroms per minute.

34. The method of claim 30, wherein copper is deposited at a rate in the range of from 500 to 10,000 angstroms per minute.

35. The method of claim 34, wherein copper is deposited at a rate in the range of from 1,000 to 5,000 angstroms per minute.

36. The method of claim 30, wherein the alkaline solution is formed from a mixture of materials selected from the group consisting of copper salts, copper sulfate, copper pyrophosphate, alkali metal pyrophosphates, including sodium pyrophosphate, ammonium pyrophosphate, orthophosphate, sodium hydroxide, potassium hydroxide, ammonium hydroxide and ethylenediaminetetraacetic acid.

37. The method of claim 30, further comprising shutting off the current after an increase in applied voltage has been detected.

38. The method of claim 30, further comprising shutting off the reverse current after a change in applied voltage has been detected.

39. The method of claim 30, wherein the step of applying a reverse current to the electrochemical cell to selectively deposit copper onto the copper film is carried out after the step of applying a current only if the copper film does not have a substantially planar surface.

* * * * *